United States Patent
Förster et al.

(10) Patent No.: US 9,324,901 B2
(45) Date of Patent: Apr. 26, 2016

(54) PRECURSOR SOLUTION FOR FORMING A SEMICONDUCTOR THIN FILM ON THE BASIS OF CIS, CIGS OR CZTS

(71) Applicants: Sunniva Marita Förster, Bad Windsheim (DE); Manfred Georg Schweizer, Bad Windsheim (DE)

(72) Inventors: Sunniva Marita Förster, Bad Windsheim (DE); Manfred Georg Schweizer, Bad Windsheim (DE)

(73) Assignee: SUNTRICITY CELLS CORPORATION (CA)

( * ) Notice: Subject to any disclaimer, the term of this patent is extended or adjusted under 35 U.S.C. 154(b) by 0 days.

(21) Appl. No.: 14/407,638

(22) PCT Filed: Apr. 22, 2013

(86) PCT No.: PCT/EP2013/001196
§ 371 (c)(1),
(2) Date: Dec. 12, 2014

(87) PCT Pub. No.: WO2013/185866
PCT Pub. Date: Dec. 19, 2013

(65) Prior Publication Data
US 2015/0155425 A1    Jun. 4, 2015

(30) Foreign Application Priority Data
Jun. 14, 2012 (EP) .................................... 12004498

(51) Int. Cl.
*H01L 31/032* (2006.01)
*H01L 31/18* (2006.01)
*C09D 5/24* (2006.01)
*H01L 21/02* (2006.01)

(52) U.S. Cl.
CPC .............. *H01L 31/1864* (2013.01); *C09D 5/24* (2013.01); *H01L 21/0256* (2013.01); *H01L 21/02557* (2013.01); *H01L 21/02568* (2013.01); *H01L 21/02628* (2013.01); *H01L 31/0322* (2013.01); *H01L 21/02554* (2013.01)

(58) Field of Classification Search
CPC .................. H01L 21/02365; H01L 21/02518; H01L 21/02612; H01L 21/02623
See application file for complete search history.

(56) References Cited

U.S. PATENT DOCUMENTS 5,714,391 A    2/1998 Omura et al.
2012/0227811 A1*    9/2012 Lau ...................... C04B 35/547
                                                                     136/262

FOREIGN PATENT DOCUMENTS

WO    2012071288 A1    5/2012
WO    2012075259 A1    6/2012

OTHER PUBLICATIONS

International Search Report and Written Opinion of the International Searching Authority, PCT/EP2013/001196, Sep. 11, 2013.
International Preliminary Report on Patentability of the International Searching Authority, PCT/EP2013/001196, Sep. 19, 2014.

* cited by examiner

*Primary Examiner* — Cheung Lee
(74) *Attorney, Agent, or Firm* — McDonald Hopkins LLC

(57) ABSTRACT

The present invention relates to a precursor solution for forming a semiconductor thin film on the basis of CIS, CIGS or CZTS by printing, comprising metal complexes of at least two different metal cations, wherein the first metal cation is a copper cation and the second is selected from the group consisting of (i) In, (ii) a combination of In and Ga, and (iii) a combination of Zn and Sn, wherein Cu and Sn, if Sn is present, is/are complexed by at least one sulfur or selenium containing anionic complex ligand or polyanion selected from the group consisting of trithiocarbonate, polysulfide or the selenium analogs thereof. If In, In with Ga, or Zn is present, their cations are complexed by an excess of trithiocarbonate and/or triselenocarbonate, and a solvent. A method for preparing such solutions and their use for manufacturing a solar cell or optoelectronic device is provided.

12 Claims, No Drawings

PRECURSOR SOLUTION FOR FORMING A SEMICONDUCTOR THIN FILM ON THE BASIS OF CIS, CIGS OR CZTS

CROSS REFERENCE TO RELATED APPLICATIONS

This application is a 35 U.S.C. 371 national stage filing and claims priority to PCT Application PCT/EP2013/001196 entitled "Precursor Solution for Forming a Semiconductor Thin Film on the Basis of CIS, CIGS or CZTS," filed Apr. 22, 2013, which claims the benefit of European Application 12 004 498.7-2203 entitled "Precursor Solution for Forming a Semiconductor Thin Film on the Basis of CIS, CIGS or CZTS" filed Jun. 14, 2012, both of which are incorporated by reference herein in their entirety.

FIELD OF THE INVENTION

The present invention relates to a precursor solution for forming a semiconductor thin film on the basis of CIS, CIGS or CZTS, particularly for a solar cell, by printing, comprising metal complexes of at least two different metal cations, wherein the first metal cation is a copper cation and the second metal cation is selected from the group consisting of (i) In, (ii) a combination of In and Ga, and (iii) a combination of Zn and Sn, wherein Cu and Sn, if Sn is present, is/are complexed by a sulfur or selenium containing anionic complex ligand or polyanion selected from the group consisting of trithiocarbonate, polysulfide or the selenium analogs thereof, and wherein if any of In, In together with Ga, or Zn is present, their cations are complexed and thus stabilized by an excess of trithiocarbonate and/or triselenocarbonate, and a solvent, a method for the preparation thereof and its use for manufacturing a solar cell or an optoelectronic device.

BACKGROUND OF THE INVENTION

Photovoltaic technology is potentially suitable to satisfy the energy need of a growing world population being confronted with a simultaneously decreasing availability of resources. Lifecycle assessment of the manufacturing process of the widely-used silicon solar cells reveals that their use is largely offset by the required energy expenditure. The high energy expenditure for the manufacture of silicon-based solar cells influences the overall production costs and thus inhibits the spread of an otherwise clean energy source at least in unsubsidized markets.

A concept for reducing the production costs of solar cells, which is already commercially successful, uses semiconductors with very high absorption coefficients. Thus, the active layers can be designed to be of low thickness and are therefore cheaper to produce. The absorption coefficients of cadmium telluride or of CuInS(Se) (CIS) are about 100 times larger than the absorption coefficient of silicon. Therefore, the thickness of the absorption layer of thin-film solar cells can be reduced by about the same factor with respect to conventional silicon-based solar cells.

However, the actual cost saving with regard to the finished solar modules merely is about 10 to 20%, because the current thin film technology requires high investments in high-vacuum evaporation plants and in particular, because chemical vapor deposition is a slow process.

In contrast thereto, printing processes for paper and sheets are matured, efficient and fast technologies. Therefore, numerous attempts have been made to adopt the technical expertise from said printing processes for the manufacturing of thin-film solar cells and semiconductor cells.

Printing processes have been successfully used for producing organic solar cells or solar cells basing on colorants. However, such dye-sensitized solar cells suffer from low light resistance and therefore have a short lifetime when being exposed to solar radiation. Consequently, only inorganic semiconductors can serve for the long-term generation of energy.

In order to use established printing processes for the manufacture of such photovoltaic cells based on inorganic semiconductor thin films, the development of novel inks is necessary. Since the highest energy yields can be achieved with CuInGaSe (CIGS) solar cells (apart from the highly toxic GaAs), most attempts focus on this material. Numerous processes have been described wherein inks for producing p-layers of CIS- or CIGS-type solar cells are used. Therein, the n-layer is still produced by chemical vapor deposition or chemical bath deposition. Since CIS/CIGS and CZTS are not soluble in currently known solvents, or only soluble to an extent that renders the printing process impractical, in the above-mentioned printing processes, suspensions of solid CIS particles are used as inks for printing; cf. for example U.S. Pat. No. 7,663,057 B2.

However, if said particles are too large (in the μm range), they sediment rapidly. A severe disadvantage of these processes is that the contact surface between the metallic conductor and the p-layer decreases with increasing particle size, having a negative impact on the conductivity between those layers. Accordingly, the conductivity within the p-layer is substantially reduced. When using such particle inks, the efficiency of the photon yield is therefore restricted. Attempts have been made to reduce the particle size, even down to the range of quantum dots. However, quantum mechanical effects lead to complications when reducing the particle size below a certain limit. For instance, the maximum theoretical quantum yield is influenced by the band gap, which in turn becomes dependent on the particle size when the latter becomes increasingly small. In addition, particles with very small sizes need to be stabilized chemically. Accordingly, if use is made of stabilizers that are strongly attached to the particle surface it becomes increasingly difficult to obtain the necessary purity of the desired semiconductor material.

In order to overcome the problems associated with inks using semiconductor particles, concepts have been developed where instead of inks containing said particles, liquid precursor solutions are used, wherein the desired semiconductor material is formed by an in situ reaction after the printing step. For the manufacturing of CIGS or CZTS (copper, zink, tin sulfide/selenide) solar cells the easiest possible approach would have been the use of soluble salts of the metal elements and to print such a solution onto a solar cell substrate. Then, in a separate process, sulfur and/or selenium could have been introduced by applying for example a $(NH_4)_2S$ or a $(NH_4)_2Se$ solution. However, this approach has turned out to be impractical for a plurality of reasons. A better approach is to use urea or thiocarbamide or selenocarbamide as sulfur/selenium source instead of free sulfide or selenide ions, and a liquid precursor solution containing all elements necessary for the in situ reaction may thus be obtained. The urea or thiocarbamide derivatives are stable up to a certain temperature so that, after printing the precursor solution, the desired compounds, e.g. CIS or CZTS, may be formed by a subsequent heating step. This concept is termed spray-pyrolysis and well-known in the field. Although a lot of research efforts have been made, the maximum achievable energy yields when using such spray pyrolysis are low. One reason for this resides in problems associated with the in situ reaction: By-products that are formed during the in situ reaction do not evaporate completely and thus reduce the purity of the desired product. In addition, crystallization of the product is impaired because the anions of the soluble metal cation salts typically form ammonium chloride which has an evaporation point above the film forming temperature and can destroy the layer integrity. A major problem associated with precursor solutions for in situ reaction are impurities formed by precursor ligands containing at least one of carbon and/or nitrogen and/or phosphorous and/or oxygen. Such impurities can substantially reduce the efficiency of semiconductors.

U.S. Pat. No. 5,714,391 describes vacuum-free vapor deposition of sulfide thin films by thermal decomposition of precursor compounds. The precursor compounds are volatized at temperatures above 240° C. The thickness of the thus produced films is preferably less then 700 nm, since the carbon content starts to increase dramatically at a film thickness of about 700 nm. Therefore, these films are not suitable to form the p-type layer of a solar cell where a minimum thickness in the μm-range, i.e. at least 1 μm, is required.

However, pyrolysis of compounds with such a high thermal decomposition temperature usually leads to a high concentration of impurities in the product, especially carbon and carbonaceous compounds. In addition, merely the synthesis of binary compounds (e.g. CuS, $Cu_2S$, CdS, etc.) are described in the two above-mentioned documents, without addressing the synthesis of compounds containing more than two elements, such as CIS, CIGS, CZTS and the like.

DETAILED DESCRIPTION OF THE INVENTION

In view of the above, the technical problem underlying the present invention is to provide novel precursor solutions suitable for the manufacturing of solar cells or optoelectronic devices by a printing process, particularly to establish a manufacturing method for solar cells, which is reduced in cost with respect to conventional manufacturing methods for solar cells, but concurrently avoids impurity problems.

According to the present invention, the above-described technical problem is solved by providing a precursor solution for forming a semiconductor thin film on the basis of CIS, CIGS or CZTS by printing, comprising metal complexes of at least two different metal cations,
wherein the first metal cation is a copper cation and the second metal cation is selected from the group consisting of (i) In, (ii) a combination of In and Ga, and (iii) a combination of Zn and Sn,
wherein Cu and Sn, if Sn is present, is/are complexed by at least one sulfur or selenium containing anionic complex ligand or polyanion selected from the group consisting of trithiocarbonate, polysulfide or the selenium analogs thereof, and
wherein if any of In, In together with Ga, or Zn is present, their cations are complexed and thus stabilized by an excess of trithiocarbonate and/or triselenocarbonate, and a solvent.

Another subject matter of the present invention relates to the use of said precursor solution for manufacturing a solar cell or an optoelectronic device, particularly by printing. The expression "printing" of the present invention is not specifically restricted and includes any process wherein a liquid is applied onto a surface. More precisely, the precursor solution is used for forming a semiconductor layer, more preferably a p-type semiconductor layer. The thickness of semiconductor layers produced by using the precursor solutions according to the present invention is not specifically restricted. However, according to the present invention, the thickness of the semiconductor layer is preferably 0.5 to 7 μm, more preferably 2 to 5 μm. If the thickness of a p-type semiconductor layer of a solar cell is too large, internal resistance increases and results in a current drop down. In addition, material is wasted. However, if the thickness of said layer is too small, only part of the incoming light will be absorbed, according to the Lambert-Beer law.

Suitable printing processes are, for example, rotogravure printing, silk screen printing or flexo printing. Preferred examples of printing processes according to the present invention are in particular slot printing e.g. as provided by Heidelberger Druckmaschinen.

In a typical embodiment of a solar cell manufactured by using the precursor solutions according to the present invention, there is provided a flexible glass substrate (e.g. as provided by Dow Corning), a metallic back contact, an inorganic semiconductor layer, particularly CIS, CIGS or CZTS, followed by an n-layer on top of this p-layer. The material for the n-layer is not particularly restricted and can be formed by CdS, ZnS or by n-type CZTS. On top of the n-layer, a transparent conductive electrode (TCO) is usually applied, followed by the cover glass. Typically, the solar cell has a back electrode layer of e.g. a Mo film that is a plus electrode on the glass substrate, on which a light absorption layer (photoelectric conversion layer) that is the inorganic semiconductor layer, particularly CIS, CIGS or CZTS, is provided.

According to the present invention, the precursor solution comprises the following three different embodiments:
(i) the first metal cation is copper and the second metal cation is indium, or
(ii) the first metal cation is copper and the second metal cation is indium and gallium together (combination of In and Ga), or
(iii) the first metal cation is copper and the second metal cation is zink and tin together (combination of Zn and Sn).

The expression "metal cation" in the context of the present invention means any cation of Cu, In, Ga, Zn and Sn, e.g. $Cu^+$, $Cu^{2+}$, $In^+$, $In^{3+}$, $Ga^+$, $Ga^{3+}$, $Zn^{2+}$, $Sn^{2+}$, $Sn^{4+}$ and the like. In this context, a person skilled in the art knows how to select the respective metal cations to achieve the respectively appropriate number of electrons, for example combining $Cu^+$ with $Sn^{4+}$ and $Cu^{2+}$ with $Sn^{2+}$, respectively.

According to the present invention, the precursor solution comprises at least one solvent. In this context, the expression "solvent" is not specifically restricted and includes any known solvent. The precursor solution of the present invention may comprise a single solvent or a combination of several solvents. Suitable solvents are, for example pyridine, DMF, DMSO, 1-methyl-2-pyrrolidone, 1-methylimidazole and, under certain circumstances, water as well. For example, $NH_4CuCS_3$ is dissolvable in water. In a preferred embodiment of the present invention, the solvent is liquid at room temperature and has a boiling point below 225° C., more preferably below 200° C. Preferred examples of solvents according to the present invention are in particular dimethylformamide (DMF) and pyridine.

According to a preferred embodiment of the present invention, the counterions of the sulfur or selenium containing anionic complex ligands or polyanions (complex counterions) are selected from $NH_4^+$ or hydrazinium or other thermally instable cations. In the context of the present invention, a thermally instable cation, anion or compound is a cation, anion or compound, respectively, having a thermal decomposition temperature of 40 to 250° C., preferably 70 to 150° C. Thermal decomposition in the context of the present application comprises the reaction of $OH^-$ to $H_2O$.

If any of In, In together with Ga, or Zn is present, their cations are complexed and thus stabilized in molar ratios or by an excess of trithiocarbonate or triselenocarbonate, respectively, depending on the solvent. For example only, if water is used, an excess is needed to shift the reaction

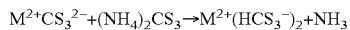

to the right side. If an excess of trithiocarbonate or triselenocarbonate, respectively, is used, molar ratios of at least 1:3, preferably at least 1:4, are generally used.

According to the present invention, the expression "excess" means "more than one equivalent".

To facilitate the subsequent printing process, the viscosity of the precursor solutions can be adjusted by using a hot substrate so as to obtain a viscosity of 2-100 cP.

According to the present invention, the anionic ligands/polyanions complexing or coordinating and thus stabilizing the metal cations employed preferably have a decomposition temperature ranging from 40 to 250° C. In a preferred embodiment of the present invention, the ligands have a decomposition temperature ranging from 70° C. to 150° C. If the decomposition temperature is too low, ligands tend to be unstable and storage of the ligands and the corresponding precursor solution tends to be difficult and costly. However, if the decomposition temperature is too high, impurities are more likely formed.

According to a specific embodiment of the present invention, the complex ligands comprise a volatile leaving group. The expression "volatile leaving group" means any structural unit of a molecule that, upon thermal decomposition of said molecule, reacts to a compound being gaseous at the thermal decomposition temperature of said molecule. Preferably, the ligand comprises a volatile leaving group such as —C(S)S— or —C(Se)Se—, forming $CS_2$ or $CSe_2$ and $(NH_4)_2S$ (which, in turn, reacts to $NH_3$ and $H_2S$), respectively. When forming semiconductor layers by pyrolysis of printed precursor compounds, a lack of S and Se is frequently observed. Therefore, it is further preferred that the ligand forms $H_2S$ and or $H_2Se$ upon pyrolysis. Thus, the lack of S and/or Se can be compensated. A particularly preferred complex ligand is trithiocarbonate. Alternatively, polyanions, i.e. polysulfides or polyselenides can be employed as well. Some trithiocarbonate/polysulfide solutions already thicken at about 50° C. which facilitates printing, especially when a rotogravure process is used. The concentration of the precursor solution depends on the used printing process but is usually within a range of between 1 to 20% by weight. For example, rotogravure printing requires a concentration between 5 to 20% by weight, slot coating a concentration of 1 to 5% by weight, in terms of the metal compounds present.

In a preferred embodiment of the present invention, the complex ligands or sulfur/selenium polyanions have a decomposition temperature as specified above and further do not contain N and/or P and/or O and/or C. Preferred ligands falling within this definition are the above-described trithiocarbonates, wherein N, P and O are absent. The C in $CS_3^{2-}$ does not affect the properties of the p-layer because the leaving group $CS_2$ evaporates at a temperature far below the carbide formation temperature. Further particularly preferred ligands falling within this definition (both N and C are absent) are polysulfides having the formula $S_n^{2-}$, wherein n is at least 2, preferably at least 3. A particularly preferred polysulfide is $S_4^{2-}$ or $S_3^{2-}$.

For Zn complexes, also zinc tetrathiocarbonates $Zn(CS_4)_2^{2-}$ can be used, even though their synthesis is somewhat more laborious.

In a further embodiment of the present invention, there is provided a method for producing the precursor solution according to the present invention, comprising the steps:

(ia) preparing a solution containing In in complexed form or In together with Ga in complexed form by dissolving or suspending a respective In salt and Ga salt, if present, in a solvent and complexing said cation(s) by means of trithiocarbonate $(CS_3)^{2-}$ by adding $(NH_4)_2CS_3$ in an equimolar ratio or an excess thereof, particularly in a molar ratio of at least 1:3, and (iia) adding a copper complex to said solution obtained in step (ia), said copper complex being selected from copper trithiocarbonate complex or copper tetrasulfide complex;

or (ib) preparing a solution containing Zn in complexed form by dissolving or suspending a respective Zn salt in a solvent and complexing said cation(s) with an excess of trithiocarbonate $(CS_3)^{2-}$ by adding $(NH_4)_2CS_3$ in a molar ratio of at least 1:3, (iib) preparing a solution containing both of Cu and Sn each in complexed form selected from their trithiocarbonate or tetrasulfide complexes, or preparing separate Cu and Sn containing solutions, and (iiib) mixing the solutions obtained in steps (ib) and (iib), wherein instead of the sulfur complexes the respective selenium complexes can be used.

As starting In, Ga and Zn salts, any dissolvable salts with an easily removable, i.e. thermally instable, anion can be used. However, their respective hydroxy salts are preferably used. As far as Zn salts are concerned, $Zn(OH)_2$ or $Zn(NH_3)_4(OH)_2$ can be particularly used. Alternatively, for example, their sulfides and selenides like $In_2Se_3$ can be used as starting compounds. However, in the latter event, complex forming tends to be somewhat slow due to the rather low solubility product of the sulfides and selenides.

In above step (iia), preferably $NH_4CuCS_3$ or $NH_4CuS_4$ is added.

In above step (ib), if water is used as solvent, for solubility reasons, it is advisable not to complex said Zn first, but to add the soluble hydroxide $(NH_3)_4Zn(OH)_2$ to the solution containing an excess of $NH_4CS_3$ as obtained in step (iib), so that the complex is formed in situ in the presence of Cu and Sn complexes; otherwise $ZnCS_3$ is not dissolvable in water. Higher concentrations (3-4%) can be achieved in e.g. DMF or DMSO. In a specific embodiment of said step (ib), $H_2S$ or $H_2Se$ gas, respectively, is passed into the precursor solution until a clear solution is obtained. Preferably, the solution is perculated with $H_2S$ or $H_2Se$ gas for at least 1 minute, particularly preferably for at least 5 minutes. Passing $H_2S$ or $H_2Se$ gas into the precursor solution increases the solubility of its components so that the precipitation of solids can be avoided. Namely, even higher concentrations can be achieved by introducing $H_2S$ or $H_2Se$.

The precursor solutions obtainable by the above method can advantageously be used for manufacturing a solar cell by a printing process, thereby establishing a manufacturing method for solar cells, which is reduced in cost with respect to conventional manufacturing methods for solar cells, but concurrently avoids impurity problems.

The above-described process for manufacturing a solar cell using the precursor solutions according to the present invention further comprises drying and heating steps carried out after the printing step. According to one embodiment, the solvent is evaporated (solvent evaporation step) either by vacuum or by heating below the decomposition temperature or a combination of both, preferably followed by a second heating step (reaction step) during which the anionic complex ligand or the anionic polychalcogenide decomposes. The temperature during the first heating step preferably ranges from room temperature (23° C.) to 70° C. In addition, vacuum may be applied during the first step, wherein the pressure is preferably selected in a range to reduce the boiling point of the solvent by 50 to 100° C. The temperature during the second heating step (reaction step) preferably ranges from 40 to 250° C., more preferably from 70 to 150° C. Although a decomposition reaction already may take place at lower temperatures, a reasonable reaction time is reached only at elevated temperature. The at least two heating steps are usually necessary to decompose the precursor first (70-150° C.), subsequently followed by a further heating step (400-550° C.), i.e. an annealing step, to obtain the desired crystal modifications by such an annealing process as well as a sufficient grain size (CIS: chalcopyrite, CIGS: chalcopyrite, CZTS: stannite/kesterite). According to the present invention, heating can be carried out by any conventional heating method, preferably by a rapid thermal process (RTP) wherein the printed layer is heated by electromagnetic irradiation. RTP allows to reduce the duration of the manufacturing method of the present invention and in addition leads to less cation migration in the n-p junction area.

The present invention also relates to the use of said precursor solutions for manufacturing a solar cell, wherein during the at least one heating step, the printed precursor solution forms a p-type semiconductor layer. Preferably, said semiconductor layer mainly comprises CIS, CIGS, i.e. $Cu(In_{1-x}Ga_x)S_2$ or $Cu(In_{1-x}Ga_x)Se_2$ where x represents a compositional ratio of In and Ga satisfying a relation of 0<x<1, or CZTS. Preferably, x is close to 0.3. Preferably, the composition of CZTS obeys the chemical formula $Cu_xZn_ySn_zS_4$ with x ranging from 1.3 to 2.0, y ranging from 1.0 to 1.4 and z ranging from 0.8 to 1.2.

For the case of CIS, only the chalcopyrite structures of $CuInS_2$ and $CuInSe_2$ are suitable to be used as a p-type semiconductor layer in a solar cell. Therefore, in the context of the present invention, the term "CIS" refers to $CuInS_2$ and $CuInSe_2$ of chalcopyrite structure. As it is known, a ternary system consisting of Cu, In and S or Se can form various phases having different structures and/or stoichiometric ratios. Therefore, it is not sufficient to simply include these three components in the stoichiometric ratio of the desired $CuInS_2$ and $CuInSe_2$. Obtaining the desired chalcopyrite structure can be triggered by setting the appropriate annealing temperature or, alternatively, by starting with a "copper poor" ink which means lower than the theoretical stochiometrical index, because the desired structure of CIS represents just one possibility among many stable phases such as $CuIn_2$, $Cu_{11}In_9$, $Cu_{16}In_9$, $Cu_7In_3$, CuS, $Cu_{2-x}S$, $CuIn_5S_8$, $CuInS_2$. However, the formation of undesired phases substantially decreases the efficiency of the p-layer, their formation has to be reduced as far as possible.

For the case of CIS and CIGS, a precursor solution according to the present invention preferably includes 0.85 to 1.1 eq. Cu, 1.0 eq. In (plus Ga).

For the case of CZTS, wherein In is replaced by Sn and Zn, the chalcopyrite-structure breaks down to stannite and kesterite structures. The band gaps of these crystal modifications of CZTS are almost similar and both of them are suitable as p-semiconductor layers. In this context, although the kesterite structure usually prevails, the term "CZTS" refers to $Cu_2ZnSnS_4$ having kesterite and/or stannite structure. Also for the case of CZTS, it is not sufficient to simply include Cu, Zn, Sn and S in the stoichiometric ratio of the desired product. Preferably, a specific heating profile is carried out. At first the solvent needs to be removed entirely, then the respective reaction products. Only then it is heated up to the annealing temperature. A broader area of single phase kesterite is stabile at higher temperatures in the phase diagram.

For the case of CZTS, a precursor solution according to the present invention preferably includes 2.0 to 1.3 eq. Cu, 1.0 to 1.4 Zn, 0.8 to 1.2 Sn. Preferably, the composition of CZTS obeys the chemical formula $Cu_xZn_ySn_zS_4$ with x ranging from 1.3 to 2.0, y ranging from 1.0 to 1.4 and z ranging from 0.8 to 1.2.

The present invention will be further illustrated in the following examples, without any limitation thereto.

EXAMPLES

Example 1

Preparation of $(NH_4)_2CS_3.nH_2O$

A volume of 300 mL of an aqueous $NH_3$ solution (32%) was added to 50 mL $CS_2$. The mixture was stirred at room temperature for twelve hours. Then the orange-colored solution was cooled to −20° C. The formation of crystal needles (triclinic) having a length of about 2 to 5 cm occurred. The product was not dried since it is not stable at room temperature. Instead, it was stored at −20° C.

Example 2

Preparation of $(NH_4)_2CSe_3.nH_2O$

The compound was prepared as described in Example 1, wherein $CS_2$ was replaced by $CSe_2$.

Example 3

Preparation of a Precursor Solution for $CuInGaS_2$ (CIGS)

$In(OH)_3$ (16.5 mmol) and $Ga(OH)_3$ (8.5 mmol) were added to a solution of $(NH_4)_2CS_3$ (100 mmol) in 100 g DMSO at room temperature and vigorously stirred until a yellow solution was obtained. Then $NH_4CuS_4$ (23.5 mmol) was added under nitrogen atmosphere. The mixture was stirred at room temperature until a dark red solution was obtained. The solution is stable for several days when stored at 0° C. under nitrogen atmosphere.

Example 4

Preparation of a Precursor Solution for CuInS/Se (CIS)

$InSe_3$ (25 mmol) was ground to a fine powder and suspended in DMF (100 mL). $(NH_4)_2CS_3$ (100 mmol) were added and the mixture was stirred at room temperature until the indium selenide was completely dissolved. Then $NH_4CuCS_3$ (cf. Dissertation Sebastian Benz, Universität Bonn 2010) or $NH_4CuS_4$ (23.5 mmol) was added under nitrogen atmosphere. The mixture was stirred until no more remainder was visible. The mixture was filtered and stored at 0° C.

Example 5

Preparation of a Precursor Solution for $Cu_2ZnSnS_4$ (CZTS)

Firstly, a 0.2 M solution of $NH_4CuCS_3$ in pyridine is prepared (solution (I)). Secondly, 60 mMol $(NH_4)_2CS_3.H_2O$ is then added to 20 mMol $Zn(OH)_2$ in 50 ml DMF and stirred until a yellow gel is formed. Perculating $H_2S$ through the obtained gel gives a clear solution (solution (II)). Thirdly, a 0.2 M solution of $(NH_4)_2SnS_3$ in pyridine is prepared (solution (III)).

Finally, solutions (I)-(III) are mixed. The mixture was filtered and stored at 0° C.

Example 6

Preparation of a Precursor Solution for $Cu_2ZnSnS_4$ (CZTS)

$(NH_4)CuCS_3 \cdot \tfrac{1}{2}H_2O$ (50 mmol) was dissolved in 50 mL water. To this solution 18 mmmol $SnS_2$ was added and gaseous $H_2S$ was passed into to the slurry until it became a clear red solution. To this solution $(NH_3)_4Zn(OH)_2$ (22 mmol) in 50 mL water was added. The mixture was filtered and stored at 0° C.

The invention claimed is:

1. A precursor solution for forming a semiconductor thin film on the basis of CIS, CIGS or CZTS by printing, comprising metal complexes of at least two different metal cations,
   wherein the first metal cation is a copper cation and the second metal cation is selected from the group consisting of (i) In, (ii) a combination of In and Ga, and (iii) a combination of Zn and Sn,
   wherein Cu and Sn, if Sn is present, is/are complexed by at least one sulfur or selenium containing anionic complex ligand or polyanion selected from the group consisting of trithiocarbonate, polysulfide or the selenium analogs thereof, and
   wherein if any of In, In together with Ga, or Zn is present, their cations are complexed and thus stabilized by an excess of trithiocarbonate and/or triselenocarbonate,
   and a solvent.

2. The precursor solution according to claim 1, wherein the metal complexes of the at least two different metal cations have a decomposition temperature ranging from 40 to 250° C.

3. The precursor solution according to claim 1, wherein the polysulfide is $S_3^{2-}$ or $S_4^{2-}$.

4. The precursor solution according to claim 1, wherein Cu is present as copper trithiocarbonate complex $(CuCS_3)^-$, $Cu(L)_2(CS_3)^-$ where L being $NH_3$ or solvent, or copper tetrasulfide complex $(CuS_4)^-$.

5. The precursor solution according to claim 1, wherein if any of In, In together with Ga, or Zn is present, their cations are complexed and thus stabilized by an excess of trithiocarbonate or triselenocarbonate, respectively, in a molar ratio of at least 1:3.

6. The precursor solution according to claim 5, where the solution has been perculated with $H_2S$ or $H_2Se$ gas, respectively, to avoid precipitation of solids.

7. The precursor solution according to claim 1, wherein the solvent is selected from the group consisting of pyridine, DMF, DMSO, 1-methyl-2-pyrrolidone, 1-methylimidazole and water and combinations thereof.

8. The precursor solution according to claim 1, wherein complex counterions are selected from $NH_4^+$ or hydrazinium.

9. A method for producing the precursor solution according to claim 1, comprising the steps:
   (ia) preparing a solution containing In in complexed form or In together with Ga in complexed form by dissolving or suspending a respective In salt and Ga salt, if present, in a solvent and complexing said cation(s) by means of trithiocarbonate $(CS_3)^{2-}$ by adding $(NH_4)_2CS_3$ in an equimolar ratio or an excess thereof, and
   (iia) adding a copper complex to said solution obtained in step (ia), said copper complex being selected from copper trithiocarbonate complex or copper tetrasulfide complex;
   or
   (ib) preparing a solution containing Zn in complexed form by dissolving or suspending a respective Zn salt in a solvent and complexing said cation(s) with an excess of trithiocarbonate $(CS_3)^{2-}$ by adding $(NH_4)_2CS_3$ in a molar ratio $Zn:(NH_4)_2CS_3$ of at least 1:3,
   (iib) preparing a solution containing both of Cu and Sn each in complexed form selected from their trithiocarbonate or tetrasulfide complexes, or preparing separate Cu and Sn containing solutions, and
   (iiib) mixing the solutions obtained in steps (ib) and (iib), wherein instead of the sulfur complexes the respective selenium complexes can be used.

10. The method according to claim 9, where the solution obtained in step (ib) has been perculated with $H_2S$ or $H_2Se$ gas, respectively, until a clear solution is obtained.

11. A process for manufacturing a solar cell or an optoelectronic device comprising forming a semiconductor layer comprising the precursor solution according to claim 1.

12. The process according to claim 11, wherein the precursor solution is subjected to at least one heating step for forming a p-type semiconductor layer comprising CIS, CIGS or CZTS on an electrode.

\* \* \* \* \*